(12) United States Patent
Dunga et al.

(10) Patent No.: US 8,937,837 B2
(45) Date of Patent: Jan. 20, 2015

(54) BIT LINE BL ISOLATION SCHEME DURING ERASE OPERATION FOR NON-VOLATILE STORAGE

(71) Applicant: Sandisk Technologies, Inc., Plano, TX (US)

(72) Inventors: Mohan Vamsi Dunga, Santa Clara, CA (US); Kwang-Ho Kim, Milpitas, CA (US); Masaaki Higashitani, Cupertino, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/886,852

(22) Filed: May 3, 2013

(65) Prior Publication Data
US 2013/0301358 A1    Nov. 14, 2013

Related U.S. Application Data

(60) Provisional application No. 61/644,067, filed on May 8, 2012.

(51) Int. Cl.
| | | |
|---|---|---|
| *G11C 11/34* | (2006.01) | |
| *G11C 16/24* | (2006.01) | |
| *G11C 16/06* | (2006.01) | |
| *G11C 7/12* | (2006.01) | |
| *G11C 16/14* | (2006.01) | |
| *G11C 16/26* | (2006.01) | |

(52) U.S. Cl.
CPC ............... *G11C 16/24* (2013.01); *G11C 16/06* (2013.01); *G11C 7/12* (2013.01); *G11C 16/14* (2013.01); *G11C 16/26* (2013.01)
USPC ................................ 365/185.19; 365/185.24

(58) Field of Classification Search
CPC .......... G11C 16/24; G11C 16/06; G11C 7/12; G11C 16/26; G11C 16/14; G11C 16/10; G11C 16/0438
USPC ........................................ 365/185.19, 185.24
See application file for complete search history.

(56) References Cited

U.S. PATENT DOCUMENTS

| | | | |
|---|---|---|---|
| 6,188,609 B1 | 2/2001 | Sunkavalli | |
| 6,373,746 B1 * | 4/2002 | Takeuchi et al. | ......... 365/185.03 |
| 6,480,419 B2 | 11/2002 | Lee | |
| 6,751,124 B2 | 6/2004 | Lee | |
| 7,301,816 B2 | 11/2007 | Li | |
| 7,489,554 B2 | 2/2009 | Nguyen | |
| 7,532,516 B2 | 5/2009 | Nguyen | |
| 7,539,060 B2 | 5/2009 | Nguyen | |

(Continued)

OTHER PUBLICATIONS

PCT International Search Report dated Sep. 13, 2013, PCT Patent Application PCT/US2013/039778.

(Continued)

*Primary Examiner* — Michael Tran
(74) *Attorney, Agent, or Firm* — Vierra Magen Marcus LLP

(57) ABSTRACT

A system for erasing non-volatile storage system that reduces the voltage across the transistor that interfaces between the sense amplifier and the bit line so that the transistor can be made smaller. Additionally, the use of the lower voltage allows for various components to be positioned closer to each other. The use of smaller components and smaller spaces between components allows the non-volatile storage system to include more memory cells, thereby providing the ability to store more data.

25 Claims, 14 Drawing Sheets

(56) References Cited

U.S. PATENT DOCUMENTS

| | | |
|---|---|---|
| 7,545,678 B2 | 6/2009 | Lee |
| 7,986,573 B2 | 7/2011 | Li |
| 8,081,514 B2 | 12/2011 | Mui et al. |
| 8,320,189 B2 | 11/2012 | Nirschl |
| 8,395,198 B2 | 3/2013 | Uchiyama |
| 8,400,860 B2 | 3/2013 | Lin |
| 2003/0051093 A1* | 3/2003 | Takeuchi ............... 711/103 |
| 2004/0057310 A1 | 3/2004 | Hosono |
| 2004/0084703 A1 | 5/2004 | Terletzki |
| 2006/0221683 A1* | 10/2006 | Chen et al. ............. 365/185.03 |
| 2007/0255893 A1* | 11/2007 | Takeuchi ............... 711/103 |
| 2008/0080239 A1 | 4/2008 | Shibata |
| 2010/0027327 A1* | 2/2010 | Chung et al. ............. 365/163 |
| 2010/0322012 A1 | 12/2010 | Suzuki |
| 2011/0096598 A1* | 4/2011 | Takeuchi et al. ......... 365/185.03 |
| 2011/0122703 A1* | 5/2011 | Li ............................ 365/185.19 |
| 2011/0170347 A1* | 7/2011 | Shibata et al. .......... 365/185.03 |
| 2012/0092931 A1* | 4/2012 | Edahiro ................... 365/185.17 |
| 2013/0016560 A1 | 1/2013 | Yano |

OTHER PUBLICATIONS

PCT Written Opinion of the International Searching Authority, dated Sep. 13, 2013, PCT Patent Application PCT/US2013/039778.

* cited by examiner

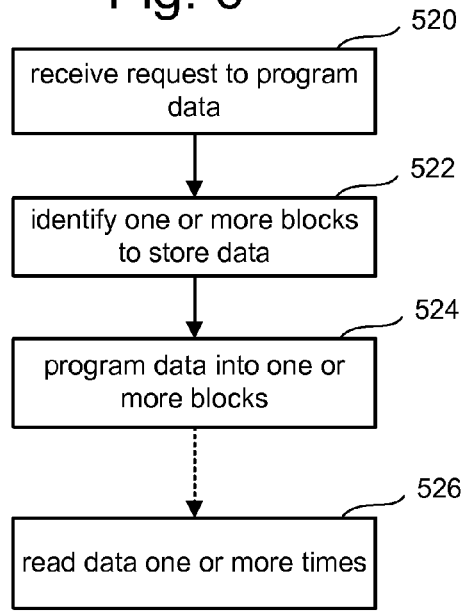
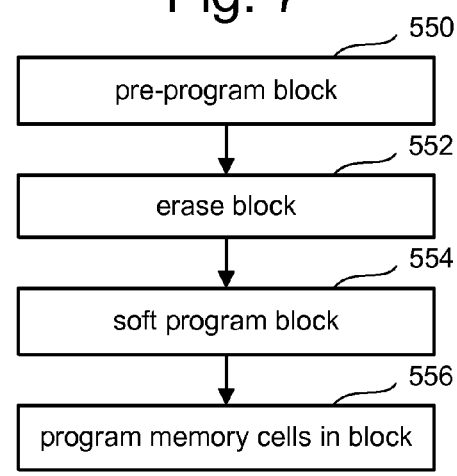

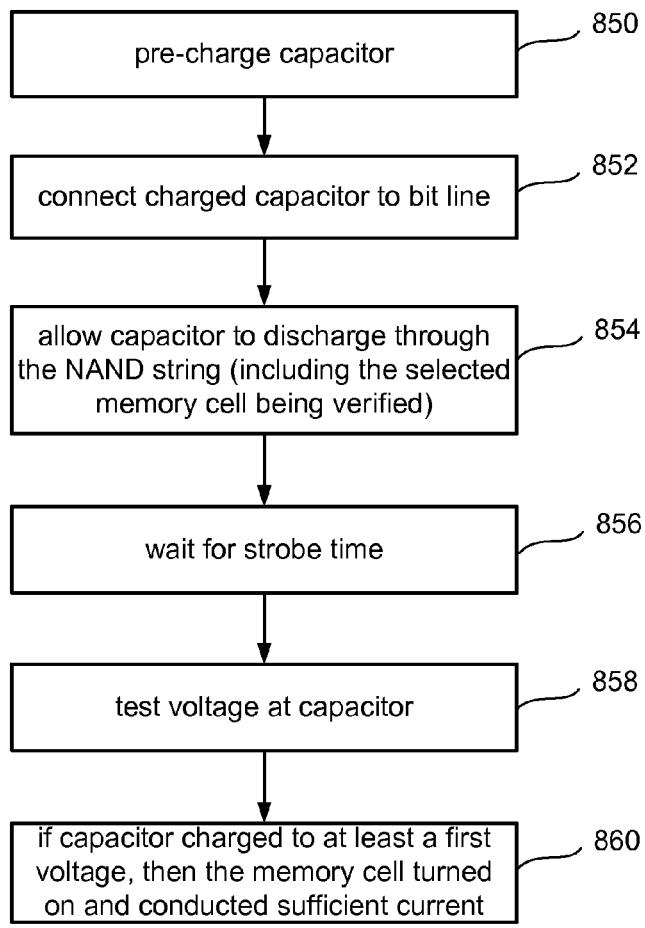
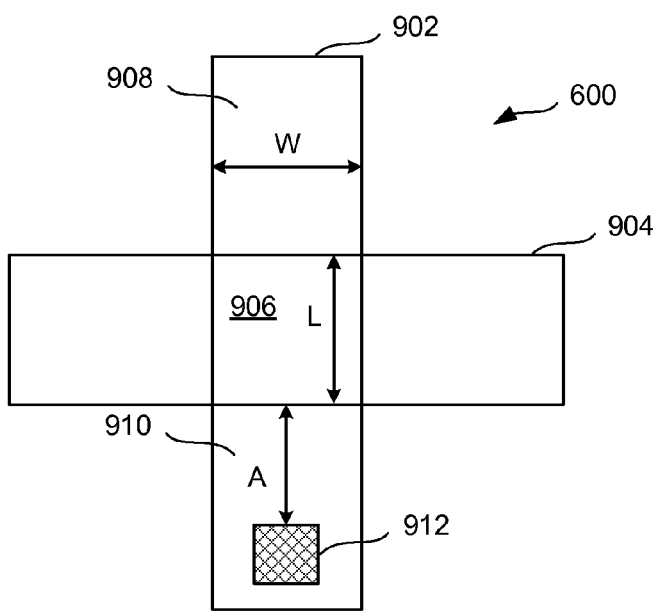

BIT LINE BL ISOLATION SCHEME DURING ERASE OPERATION FOR NON-VOLATILE STORAGE

This application claims the benefit of U.S. Provisional Application 61/644,067, filed on May 8, 2012.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line BL is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

BRIEF DESCRIPTION OF THE DRAWINGS

FIG. 6 is a flow chart describing one embodiment of a process for programming.
FIG. 7 is a flow chart describing one embodiment of a process for programming data into a block of memory cells.
FIG. 13 is a flow chart describing one embodiment of a process for sensing used during a read operation.
FIG. 16 shows a layout of a transistor.

DETAILED DESCRIPTION

In order to increase the amount of data that can be stored by a non-volatile storage system, it is advantageous to shrink the size of the components of the system so that there is room to fit more memory cells. In some cases, the size of a transistor (or other component) cannot be made smaller because that transistor (or other component) must be designed to tolerate large voltages. One example of such a component that needs to be able to tolerate a large voltage is the transistor that interfaces between the sense amplifier (discussed below) and the bit line BL. The technology described herein provides a system for reducing the voltage across the transistor that interfaces between the sense amplifier and the bit line BL so that the transistor can be made smaller. The use of smaller components allows the non-volatile storage system to include more memory cells, thereby providing the ability to store more data.

Additionally, the use of the lower voltage discussed above allows for various components to be positioned closer to each other. Smaller spaces between components allows the non-volatile storage system to include more memory cells, thereby providing the ability to store more data.

Figure 1:
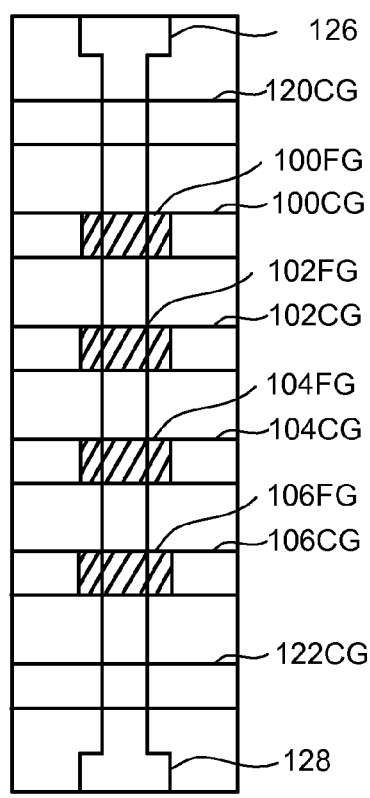
FIG. 1 is a top view of a NAND string.
Figure 2:
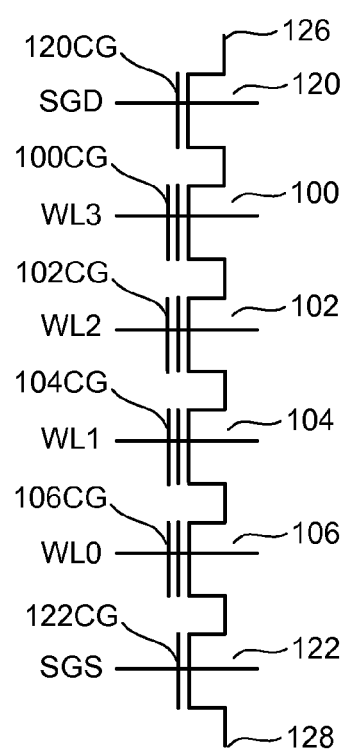
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line BL via bit line BL contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line BL by its drain select gate controlled by select line SGD. Each bit line BL and the respective NAND string(s) that are connected to that bit line BL via a bit line BL contact comprise the columns of the array of memory cells. bit line BLs are shared with multiple NAND strings. Typically, the bit line BL runs on top of the NAND strings in a direction perpendicular to the word lines and is connected to a sense amplifier.

In some embodiments, the NAND strings are implemented in a triple well structure comprising a P substrate, a N-well in the P substrate and a P-well in the N-well. The NAND strings on the top surface of the P-well. Other embodiments can include the NAND strings implemented on a N-Well, which is in a P-well, which is in a N substrate.

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
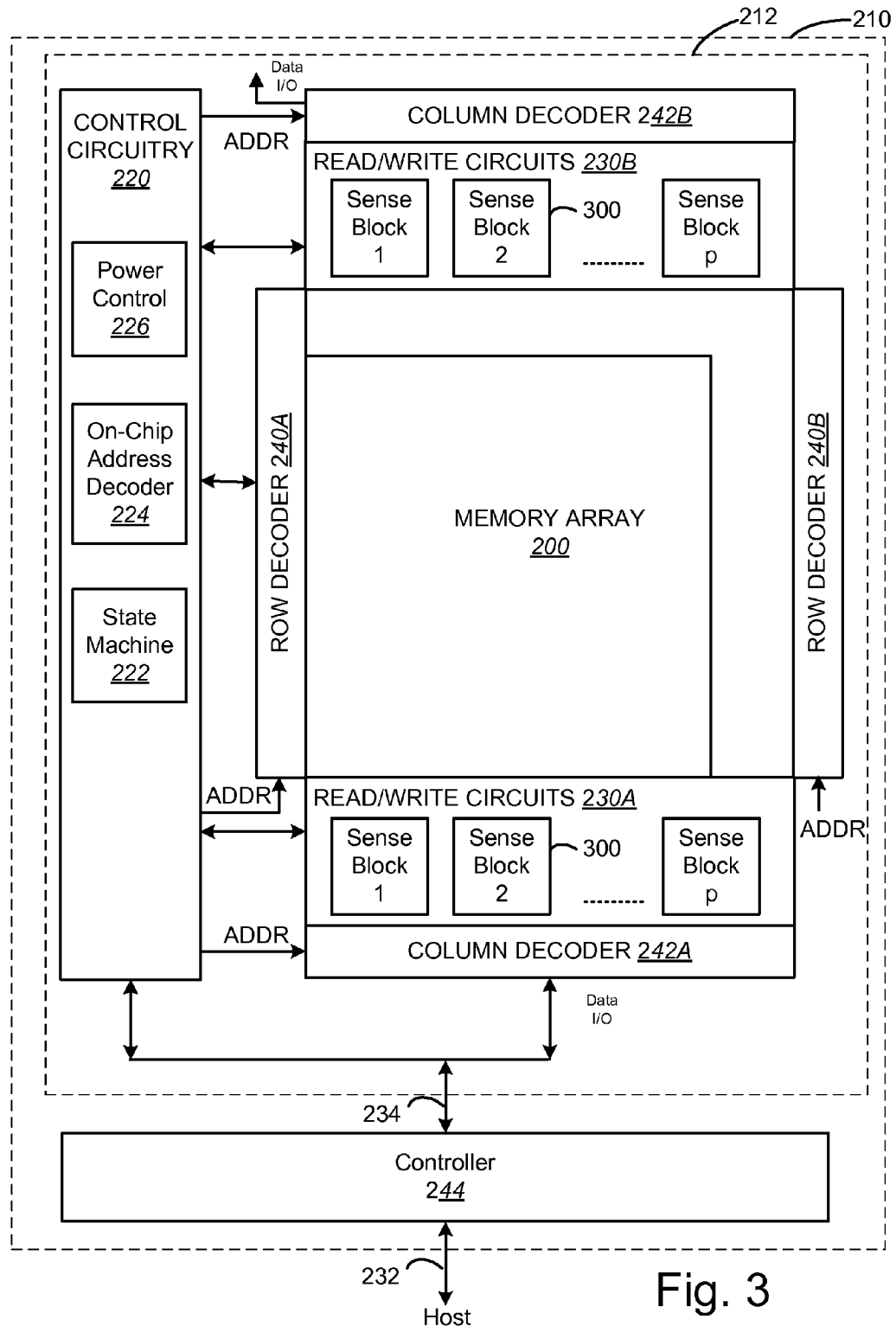
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit line BLs via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit line BLs during memory operations. In one embodiment, power control module 226 includes one or more charge pumps that can create voltages larger than the supply voltage. Control circuitry 220, power control 226, decoder 224, state machine 222, decoders 240

A/B & 242A/B, the read/write circuits 230A/B and the controller 244, collectively or separately, can be referred to as one or more managing circuits.

Figure 4:
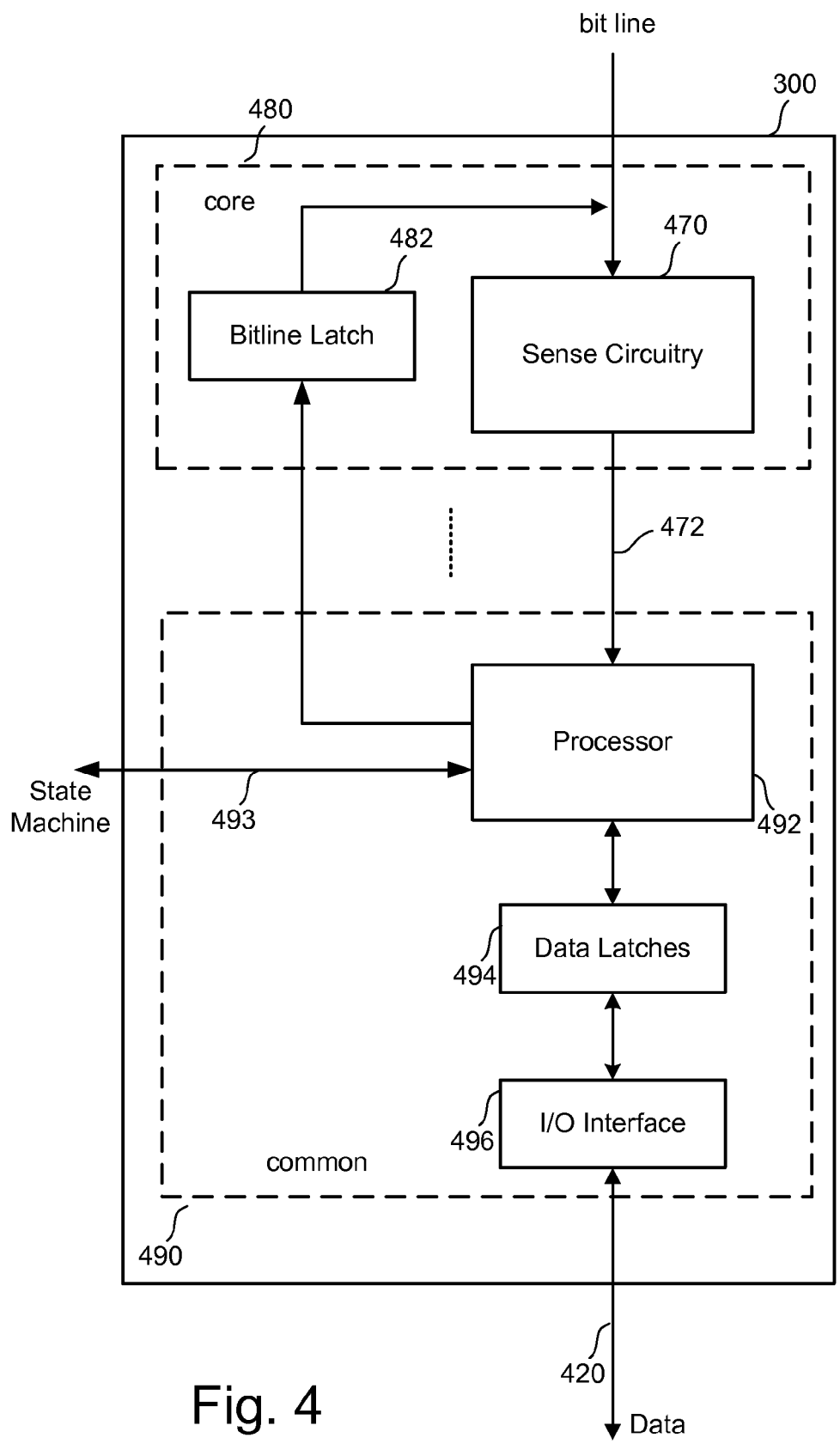
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line BL and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line BL is above or below a predetermined level. In some embodiments, sense module 480 includes a circuit commonly referred to as a sense amplifier. Sense module 480 also includes a bit line BL latch 482 that is used to set a voltage condition on the connected bit line BL. For example, a predetermined state latched in bit line BL latch 482 will result in the connected bit line BL being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line BL latch 482 serves double duty, both as a latch for latching the output of the sense module 480 and also as a bit line BL latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit line BLs such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line BL latch 482 so as to cause the bit line BL to be pulled to a state designating program inhibit. This inhibits the memory cell coupled to the bit line BL from further programming even if it is subjected to programming pulses on its control gate. In other embodiments the processor initially loads the bit line BL latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
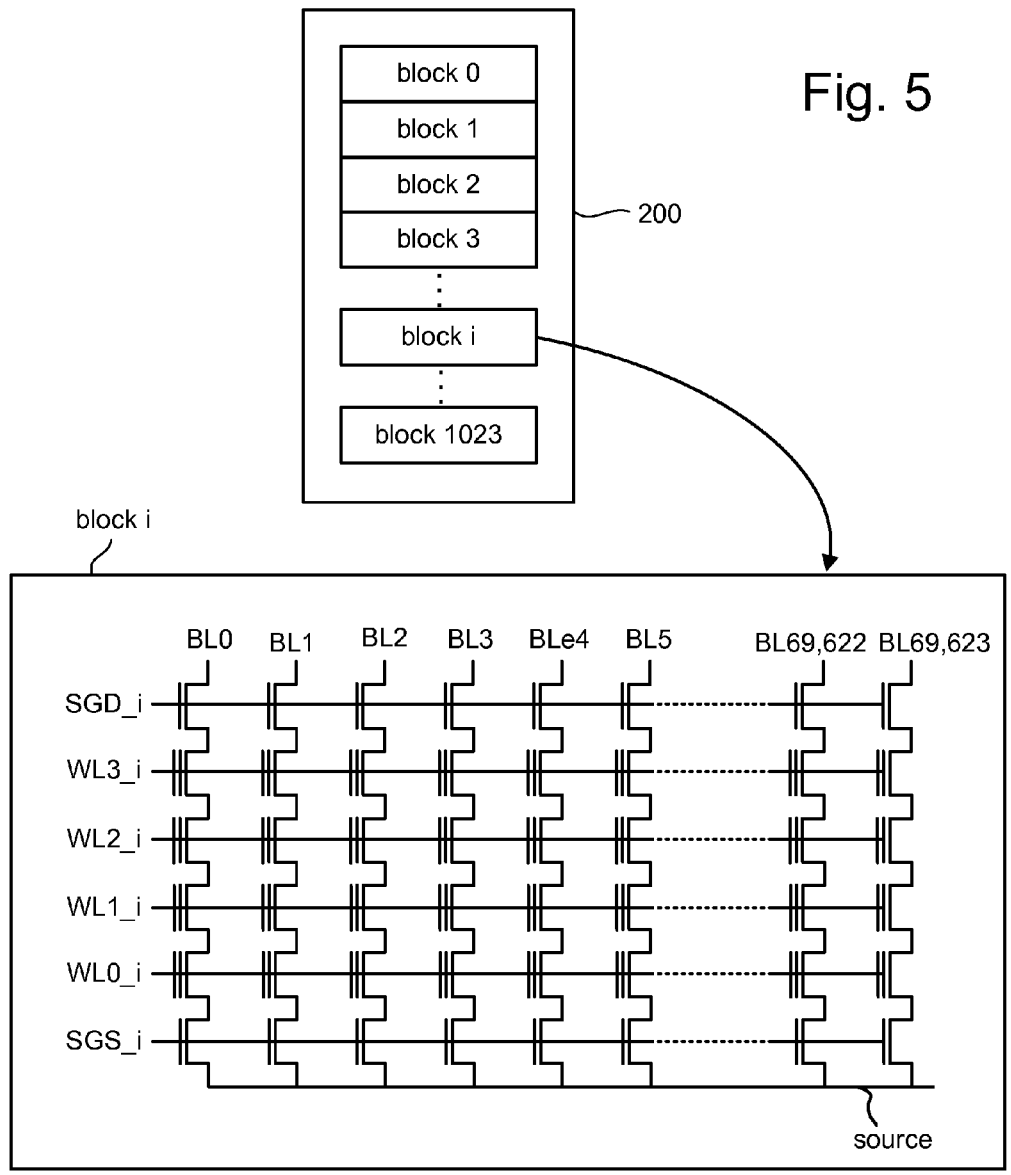
FIG. 5 is a block diagram depicting one embodiment of a memory array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit line BLs BL0, BL1, ... BL69,623. In one embodiment, all of the bit line BLs of a block can be simultaneously selected during read and program operations. Memory cells along a common word line and connected to any bit line BL can be programmed (or read) at the same time (e.g., concurrently). In another embodiment, the bit line BLs are divided into even bit line BLs and odd bit line BLs. In an odd/even bit line BL architecture, memory cells along a common word line and connected to the odd bit line BLs are programmed at one time, while memory cells along a common word line and connected to even bit line BLs are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line BL via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for programming. In step 520, a request for programming is received from the Host, the Controller or other entity.

In step 522, the Controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage Vera (e.g., 20-24 volts) for a sufficient period of time and grounding the word lines of a selected block while the source and bit line BLs are floating. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. In blocks that are not selected to be erased, word lines are floated. Due to capacitive coupling, the unselected word lines, bit line BLs, select lines, and the common source line are also raised to a significant fraction of the erase voltage thereby impeding erase on blocks that are not selected to be erased. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

Figure 8:
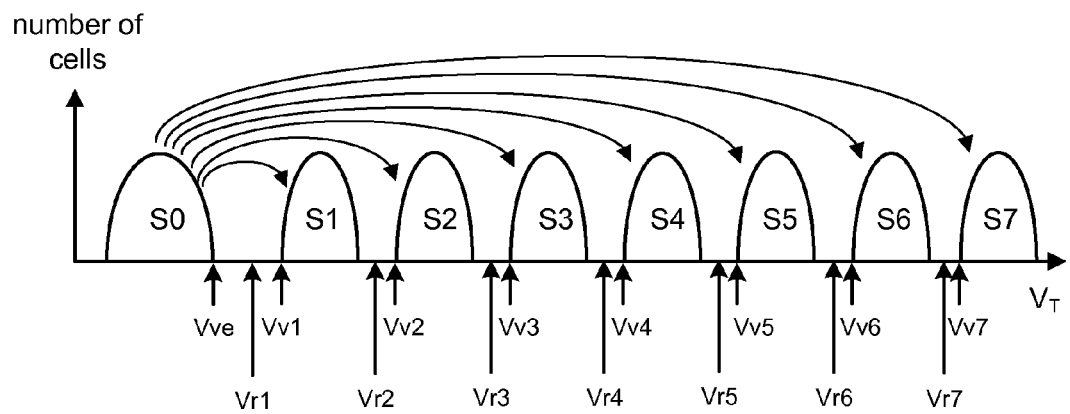
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit line BLs, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels (also known as target levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is sensed to determine whether the memory cell turned on in response to the voltage applied to the word line. If the conduction current is sensed to be greater than a certain value, then it is assumed that the memory cell turned on and the voltage applied to the word line is greater than the threshold voltage of the memory cell. If the conduction current is not sensed to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to sense/measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line BL. The voltage on the bit line BL is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 9:
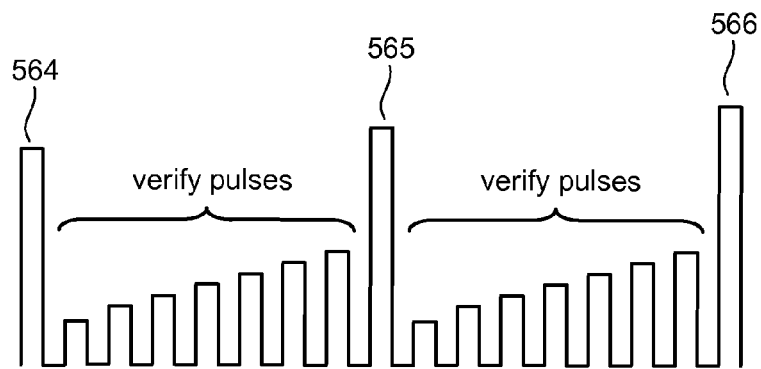
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. No. 7,301,817; U.S. Patent App. 2004/0109362; and U.S. Patent App. 2009/0147573.

Figure 10A:
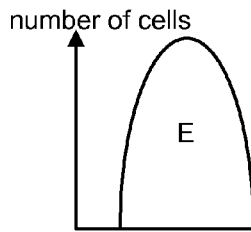
FIGS. 10A-E show various threshold voltage distributions and describe a process for programming non-volatile memory.
Figure 10B:
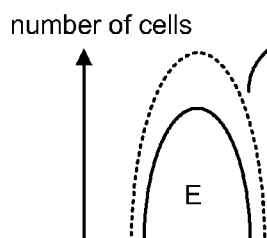

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
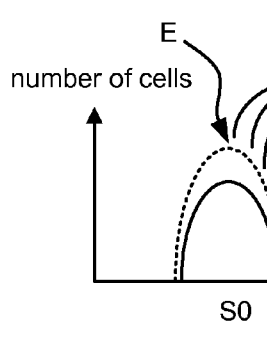
Figure 10D:
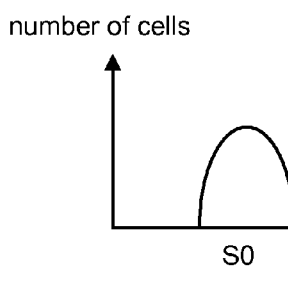
Figure 10E:
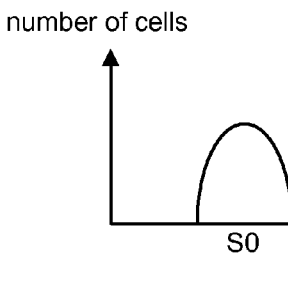

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 11:
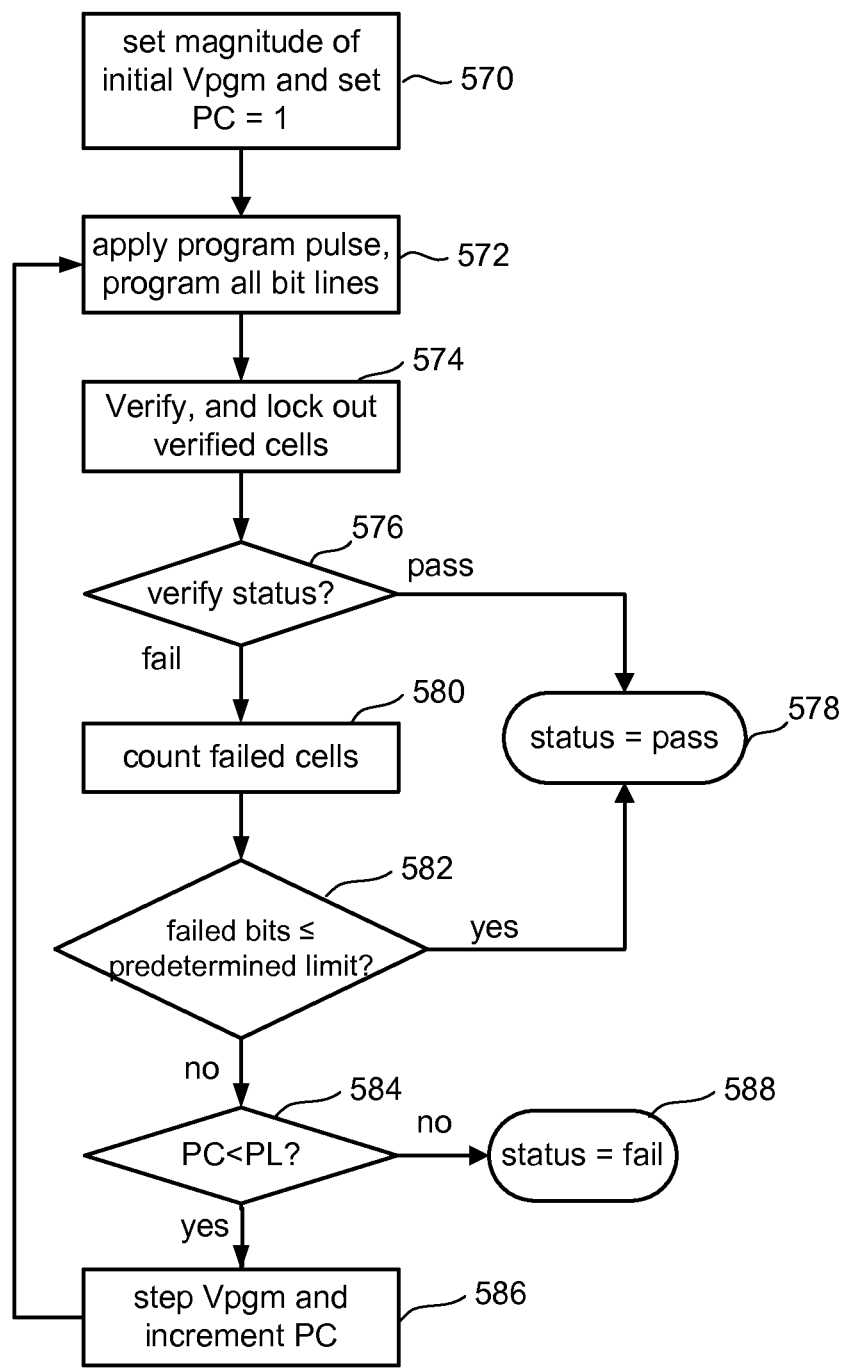
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line BL is grounded. On the other hand, if the memory cell should remain at its current threshold voltage, then the corresponding bit line BL is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 12:
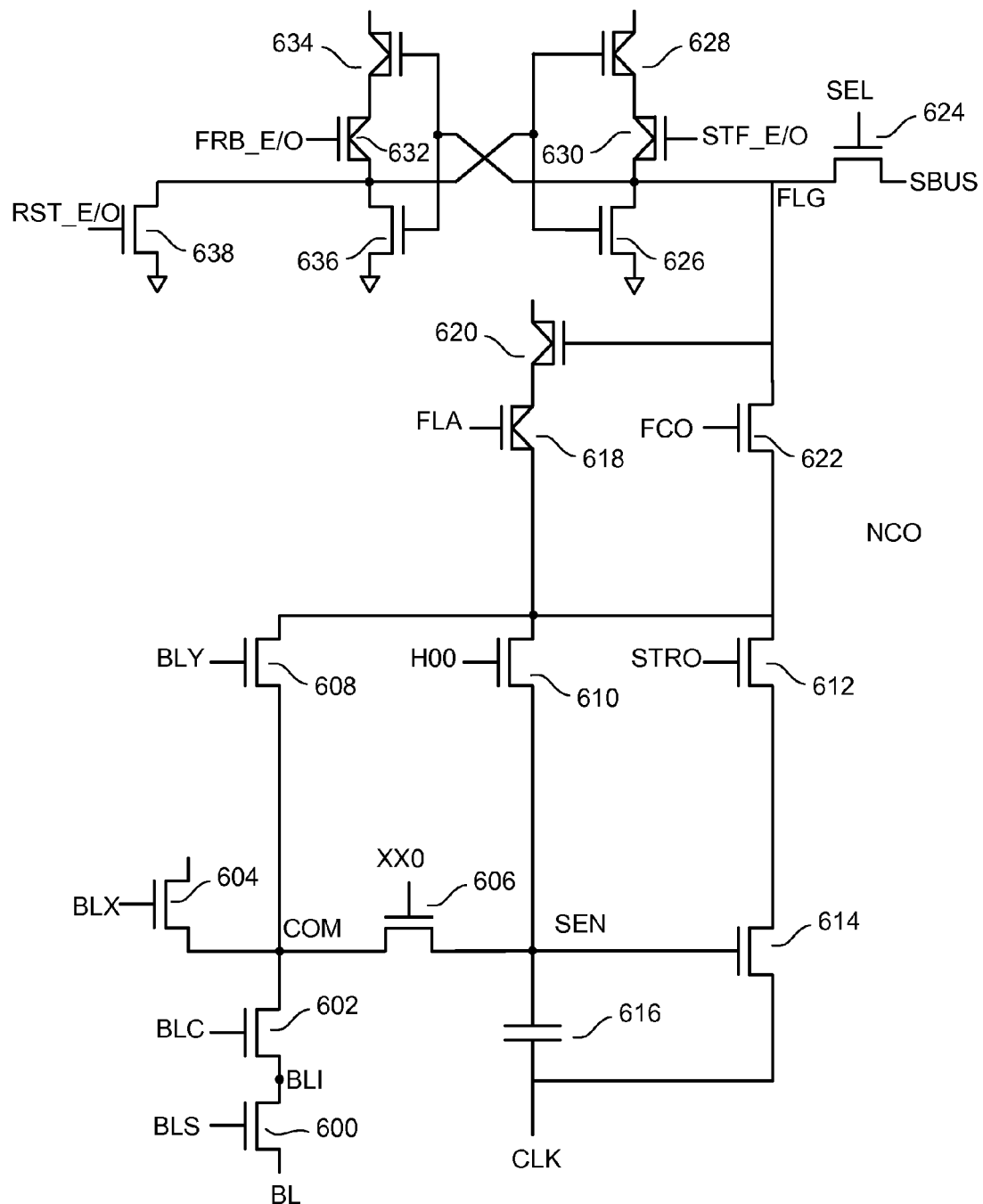
FIG. 12 is a schematic of one embodiment of a sense amplifier.

FIG. 12 is a schematic diagram depicting a sense amplifier circuit from sense circuitry 470 (see FIG. 4). This sense amplifier circuit can be used to sense the conduction current of a memory cell during a read or verify operation, as discussed above. This sense amplifier circuit is also used to generate the bit line voltages used during programming. Other configurations of the sense amplifier can also be used.

FIG. 12 shows transistors 600, 602, 604, 606, 608, 610, 612, 614, 616, 618, 620, 622, 624, 626, 628, 630, 632, 634, 636 and 638. Bit line Shield Transistor 600, connected to the bit line BL and transistor 602, serves as an interface between the sense amplifier of FIG. 12 and the bit line BL. In one embodiment, the sense amplifier comprises low voltage transistors. Transistor 600 operates to shield the low voltage transistors of the sense amplifier from high voltages on the bit line BL. High voltages on BL occur typically during the Erase operation. Transistor 600 receives the signal BLS at its gate, and based on the voltage of BLS will connect to or isolate the bit line BL from the sense amplifier.

Transistor 602 receives the signal BLC at its gate, and is used as a voltage clamp. The gate voltage BLC is biased at a constant voltage equal to the desired bit line voltage plus the threshold voltage of transistor 602. The function of transistor 602, therefore, is to maintain a constant bit line voltage during a sensing operation, even if the current through the bit line BL changes.

Transistor 602 is connected to transistors 604, 606 and 608. Transistor 606 is connected to capacitor 616 and the SEN node. The purpose of transistor 606 is to connect capacitor 616 to the bit line BL and disconnect capacitor 616 from the bit line so that capacitor 616 is in selective communication with the bit line BL. Transistor 606 regulates the strobe time mentioned below. That is, while transistor 606 is turned on capacitor 616 can be charged or discharged by current from and through the bit line BL, and when transistor 606 is turned off capacitor 616 cannot be charged or discharged by a current from and through the bit line BL.

The node at which transistor 606 connects to capacitor 616 (the SEN node) is also connected to transistor 610 and transistor 614. Transistor 610 is connected to transistors 608, 612 and 618. Transistor 618 is also connected to transistor 620. Transistors 618 and 620 are PMOS transistors while transistors 600-618 of FIG. 12 are NMOS transistors. Transistors 610, 618, and 620 provide a pre-charging path to capacitor 616. A voltage (e.g. VddSA or other voltage) is applied to the source of transistor 620. By appropriately biasing transistors 610, 618 and 620, the voltage applied to the source of transistor 620 can be used to pre-charge capacitor 616. After pre-charging to a known starting voltage, capacitor 616 can be discharged by a current from and through the bit line BL via transistor 606 (assuming that transistors 600 and 602 are conducting and that the memory cells in the connected NAND string are conducting).

Transistors 612 and 622 provide a path for communicating the data from SBUS (via transistor 624) to transistor 614. Transistor 622 receives the signal FCO at its gate. Transistor 612 receives the signal STRO at its gate. By raising or lowering FCO and STRO, a path is provided or cut off between FLG node and transistor 614. The gate of transistor 614 is connected to capacitor 616, transistor 606 and transistor 610 at the NEN node. The other side of capacitor 616 is connected to the signal CLK.

As discussed above, capacitor 616 is pre-charged via transistors 610, 618 and 620. This will raise the voltage at the node SEN to a known pre-charge voltage level (Vpre). When transistor 606 turns on, capacitor 616 can lose additional charge from current flowing in the bit line and to capacitor 616 via transistors 600, 602 and 606. During a sense operation, a read compare voltage (or verify compare voltage) will be applied to the selected memory cell and Vread (~7-11 volts) is applied to unselected memory cells in order to make the unselected memory cells turn on and conduct current. If the threshold voltage of the selected memory cell is lower than the read compare voltage (or verify compare voltage), then the selected memory cell will turn on and conduct current, which means the NAND string and bit line will conduct current and cause capacitor 616 to lose charge. If the capacitor 616 is able to charge down in response to current flowing in the bit line, then the voltage at the capacitor (at the SEN node) will decrease.

The pre-charge voltage (Vpre) at the SEN node is higher than the threshold voltage of transistor 614; therefore, prior to the strobe time (the time the capacitor is allowed to discharge from the current in the bit line BL), transistor 614 is ON (conducting). If the voltage of the capacitor falls below the threshold voltage of transistor 614 before the end of the strobe time, then transistor 614 will turn OFF and will not allow the charge from FLG to dissipate into CLK node. If the voltage of the capacitor does not fall below the threshold voltage of transistor 614 before the end of the strobe time, then transistor 614 will remain ON and will allow the charge from FLG to dissipate into CLK node. Therefore, testing the voltage at FLG will indicate whether current flows in the bit line and NAND sting. In other words, if FLG has not been dissipated, then current flowed in the NAND string due to the selected memory cell turning on so it is known that the threshold voltage of the selected memory cell is less than the read compare voltage (or verify compare voltage) be applied to the control gate of the selected memory cell. If FLG has been dissipated, then sufficient current did not flow in the NAND string due to the selected memory cell no turning on so it is known that the threshold voltage of the selected memory cell is greater than or equal to the read compare voltage (or verify compare voltage) being applied to the control gate of the selected memory cell. Transistors 626-636 form the data latch. At the beginning of the sense operation, the latch is used to set the FLG node to high. This is initiated by the transistor 638. At the end of sensing operation, depending on the state of the memory cell, the FLG node stays high or discharges to low. This sensing result is stored (latched) in the data latch. When the SEL goes high, the sensing result from the data latch is finally transferred to SBUS.

FIG. 13 is a flow chart describing one embodiment of a process for sensing the conduction current of a memory cell during a read or verify operation, as discussed above, using the circuit of FIG. 12. In step 850 of FIG. 21, the capacitor will be pre-charged to a pre-determined voltage level. In step 852, the pre-charged capacitor will be connected to the bit line (as discussed above). In step 854, the capacitor will be allowed to discharge down based on current through the bit line and NAND string (including the selected memory cell being read/verified). The system will wait for a predetermined strobe time in step 856. At the conclusion of the strobe time (step 858), the sense amplifier will test the voltage across capacitor 616 (as discussed above). In step 860, it is determined that if the capacitor 616 discharged to at least a first voltage, then the selected memory cell turned on and conducted sufficient current; therefore, the threshold voltage of the selected memory cell is lower than the voltage applied to the control gate of the selected memory cell. If the capacitor 616 did not discharge down to at least the first voltage, then the selected memory cell remained off and did not conduct sufficient current; therefore, the threshold voltage of the selected memory cell is not lower than the voltage applied to the control gate of the selected memory cell.

Figure 14:
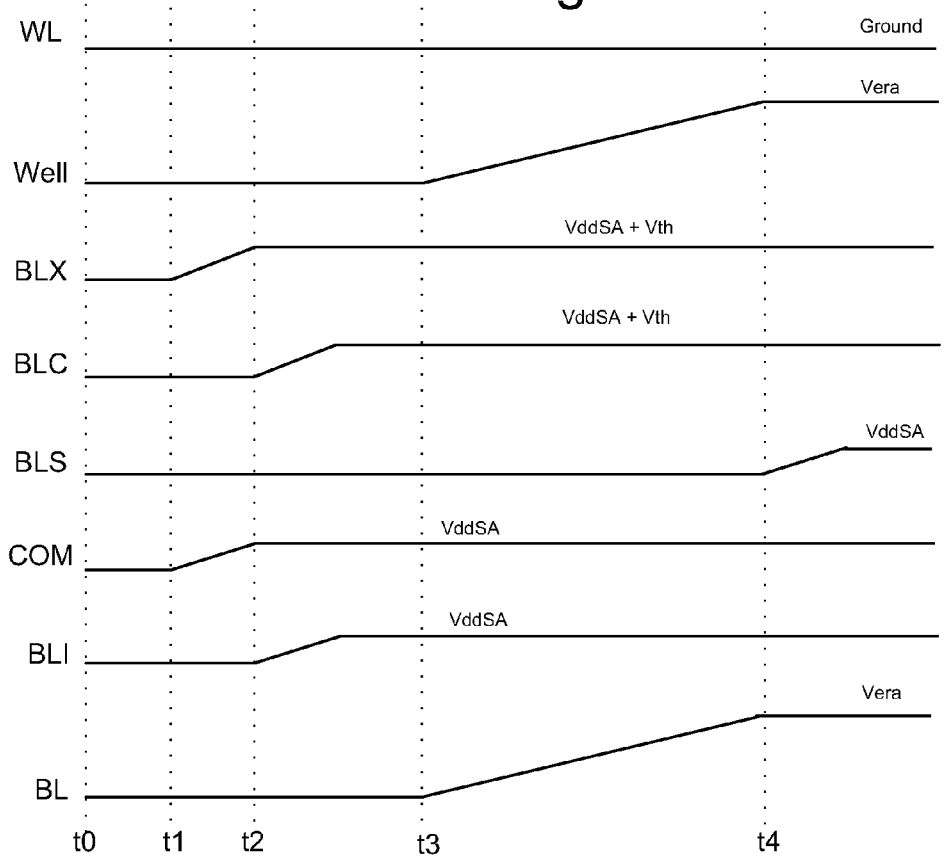
FIG. 14 is a timing diagram describing an erase operation.

As discussed above, memory cells are erased in one embodiment by raising the p-well (or in other embodiments an n-well) to an erase voltage Vera (e.g., 18-24 volts) for a sufficient period of time while grounding the word lines of a selected block and while the source and bit line BLs are floating. FIG. 14 is a timing diagram describing one embodiment of an erase process used by prior art memory systems. The signals depicted in FIG. 14 include WL (word lines in the selected block), WELL (the voltage of the p-well), BLX, BLC, BLS, COM, BLI and BL (bit lines for the selected block). All the signals are at ground at time t0. The word line will remain grounded during the time depicted in FIG. 14. At time t1, the signal BLX is raised to VddSA+Vth (the threshold voltage of transistor 604). In one embodiment, the VddSA is the highest voltage generated for use inside the sense amplifier. One example of VddSA is 2.6 volts; however, other voltages can also be used. In response to BLX ramping up to VddSA+Vth, at t1 the COM node will also rise up to VddSA. At time t2, the signal BLC is raised to VddSA+Vth (threshold voltage of transistor 602). In response to BLX being raised to VddSA+Vth, the node BLI will also rise up to VddSA at t2. At time t3, the WELL voltage will be raised to the erase voltage Vera. During the time period between t3 and t4, the WELL voltage is ramped up from ground to Vera. Since the bit lines are floating, they will couple to the p-well and, therefore, the bit line voltage will also ramp-up to Vera from time t3 to time t4. At t4, the signal BLS is raised to VddSA. After time t4, the voltage differential between the p-well and the word lines of the selected blocks is approximately equal to Vera; therefore, an erase operation will begin because a strong electric field is applied to the tunnel dielectric layers of the selected memory cells and the selected memory cells are erased as electrons in the floating gates are emitted to the substrate, typically by a Fowler-Nordheim tunneling mechanism. As electrons are transferred from the floating gate to the substrate, the threshold voltage of the selected memory cells will be lowered.

Figure 15:
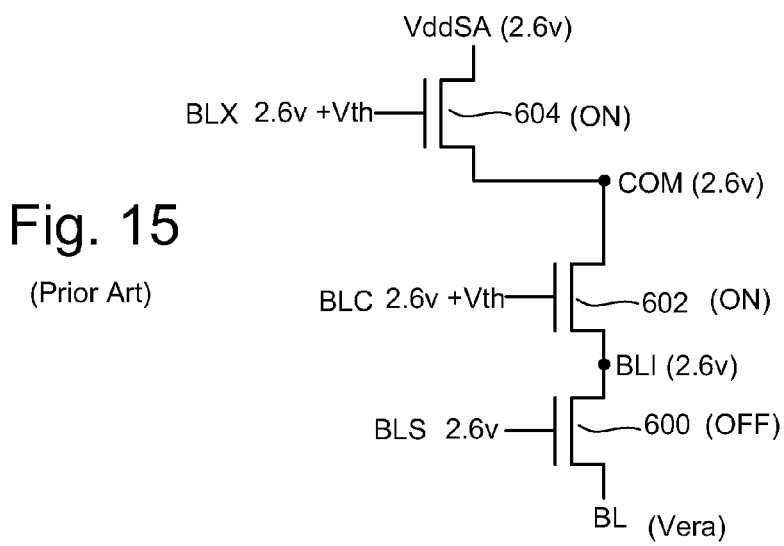
FIG. 15 is a schematic of three transistors associated with a sense amplifier.

FIG. 15 depicts transistors 600, 602 and 604 from the sense amplifier circuit of FIG. 12. FIG. 15 also shows voltages at the various points in the circuit subsequent to BLS being raised to VddSA after time t4. As can be seen, because the gate of transistor 604 is receiving VddSA (2.6 volts)+Vth (threshold voltage of transistor 604), transistor 604 is turned on. The source of transistor 604 is at VddSA. The drain of transistor 604 is connected to the COM node, which is at 2.6 volts (VddSA). Because the gate of transistor 602 receives VddSA+Vth (threshold voltage of transistor 602), transistor 602 is turned on and communicates VddSA (2.6 volts) from the COM node to the BLI node. The bit line voltage is at Vera. Because transistor BLS receives 2.6 volts at its gate, transistor 600 remains off. Therefore, the sense amplifier (including node BLI) is cut off from the bit line; thereby, protecting the sense amplifier from the high voltage used on the bit line during erase.

FIG. 16 shows an example layout for transistor 600. Stripe 902 represents the active area for the transistor, having a width W. Stripe 904 represents the gate line (e.g. BLS). Box 906 represents the area of the channel, with a channel length L. Area 908 is a low voltage junction. Area 910 is a high voltage junction, and is N– doped. Shaded area 912 is an N+ high doped implant area that functions as a bit line contact because it has a lower resistance. As discussed above, during an erase process, area 912 (which is connected to the bit line) will rise to Vera. In general, if the drain to source voltage is large, then the length of the channel L needs to be longer to prevent breakdown. Furthermore, if the gate voltage is relatively low and the drain voltage is relatively high (e.g. Vera), then there could be gate induced drain leakage (GIDL). To avoid GIDL, the length A is made longer. Because it is desired to make the transistor smaller so it uses less real estate on the integrated circuit and more area can be used for memory cells, it is desired to reduce the channel length L and reduce the distance A. One way to reduce L and A is to reduce the voltage differential between the drain and gate and the voltage differential between the drain and source of transistor 600.

In systems where there is a large voltage differential between the bit line and the node BLI, then the bit line and node BLI need to be separated by a minimum distance to prevent an electric field between the two from causing a breakdown. Thus, by reducing the voltage differential between the bit line and the node BLI, then the bit line and node BLI can be positioned closer together, thereby allowing more room for additional components (such as other additional memory cells).

Figure 17:
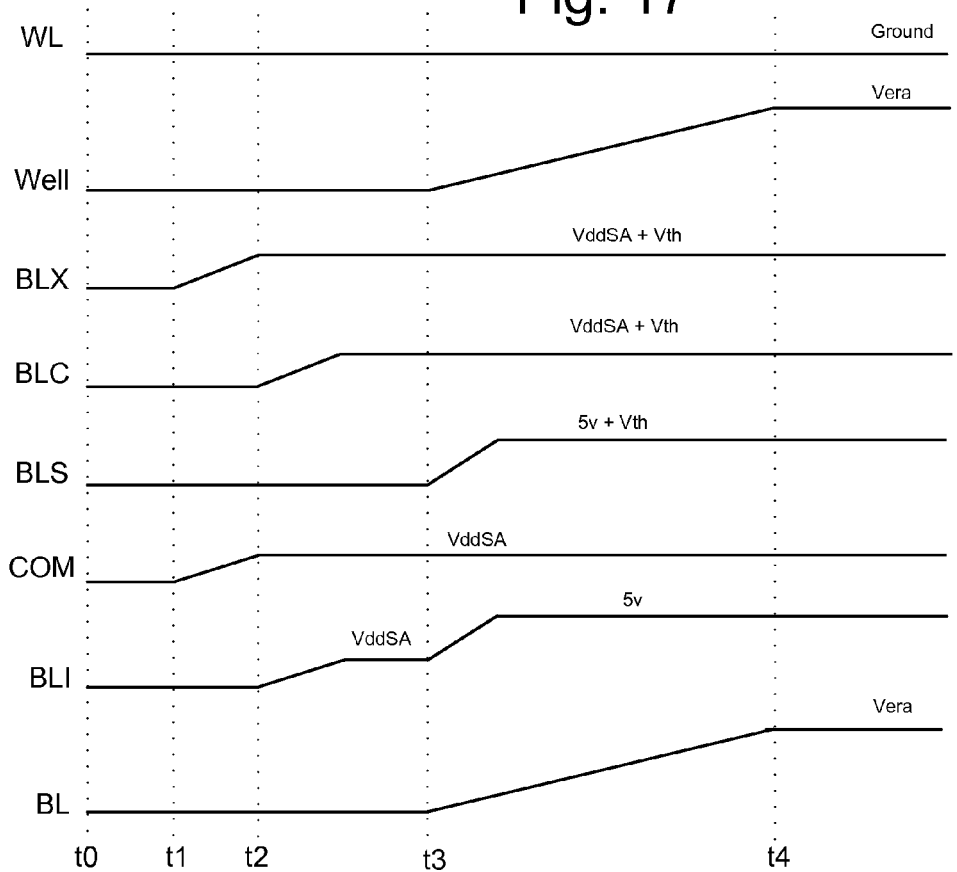
FIG. 17 is a timing diagram describing an erase operation.
Figure 18:
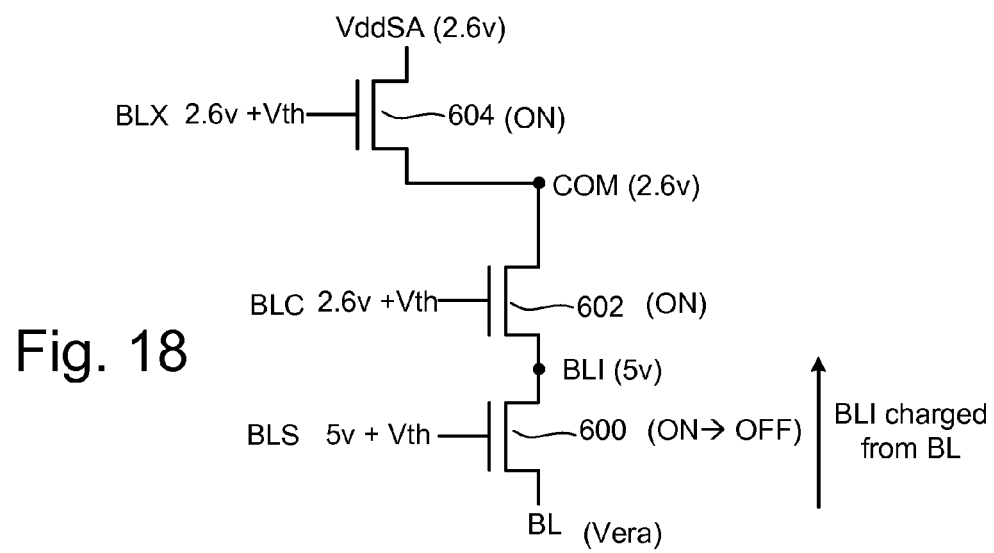
FIG. 18 is a schematic of three transistors associated with a sense amplifier.

Therefore, it is desired to reduce the voltage differential across transistor 600. One means for reducing the above-described voltage differentials is to increase the voltage at node BLI and at the gate of transistor 600. FIGS. 17 and 18 describe one embodiment for performing an erase operation that reduces the voltage differential between the drain and source as well as between the drain and gate of transistor 600 so that transistor 600 could be made smaller.

FIG. 17 is a timing diagram depicting the behavior of the same signals illustrated in FIG. 14 during an erase operation for one embodiment of performing an erase operation with a lower voltage differential across transistor 600. All of the signals depicted are at ground at time t0. At time t1, signal BLX is raised from ground to VddSA+Vth (threshold voltage of transistor 604). In response, the COM node is also raised at t1 to VddSA. At time t2, the signal BLC is raised to VddSA+Vth (threshold voltage of transistor 602). As a result of BLC being raised, the BLI node is raised to VddSA at time t2. In this embodiment, at time t3 the signal BLS is raised to 5 volts+Vth (threshold voltage of transistor 600). At time t3, the WELL voltage begins a ramp-up to Vera. In response to the WELL voltage ramping up to Vera, the bit lines (which are floating) will couple to the WELL and also ramp-up to Vera. BLI node will follow the floating bit lines until the bit lines and BLI node reach 5V. After BLI and bit lines reach 5V, BLS transistor 600 turns OFF and the BLI node is disconnected from floating BLs. The floating bit lines continue to rise along with WELL voltage. The Well reaches Vera at t4. Therefore, the gate of transistor 600 (bit line shield transistor) is raised to a level above VddSA prior to completing the ramping up of the well voltage. In some embodiments, the gate of transistor 600 (bit line shield transistor) is raised to a level above VddSA while ramping up of the well voltage. At time t4, the memory cells will experience erasing as electrons are transferred from the floating gate to the substrate (as explained above).

FIG. 18 shows the state of transistor 600, 602 and 604 just after time t4. Since BLX is at 2.6 volts+Vth, transistor 604 is turned on and will transfer VddSA (2.6 volts) to the COM node. Since the BLC signal is at 2.6 volts+Vth, transistor 602 will turn on and transfer 2.6 volts from COM node to BLI. However, in this embodiment, BLS is at 5 volts+Vth; therefore; transistor 600 turns on (at least initially) so that some of the charge from the bit line will leak through transistor 600 and charge up BLI node to 5 volts. Once BLI node reaches 5 volts, transistor 600 will turn off. FIG. 18 shows a vertical arrow indicating that the BLI node is charged (from VddSA to 5 volts) from the Bit Line. In this manner, the BLI node is charged from 0 to VddSA by the sense amplifier and from VddSA to 5 volts by the bit lines (based on coupling from the well). In one embodiment, the limit to which the BLI node can be charged is dictated by the junction break down tolerance of transistor 602 and the low voltage source junction of transistor 600.

Figure 19:
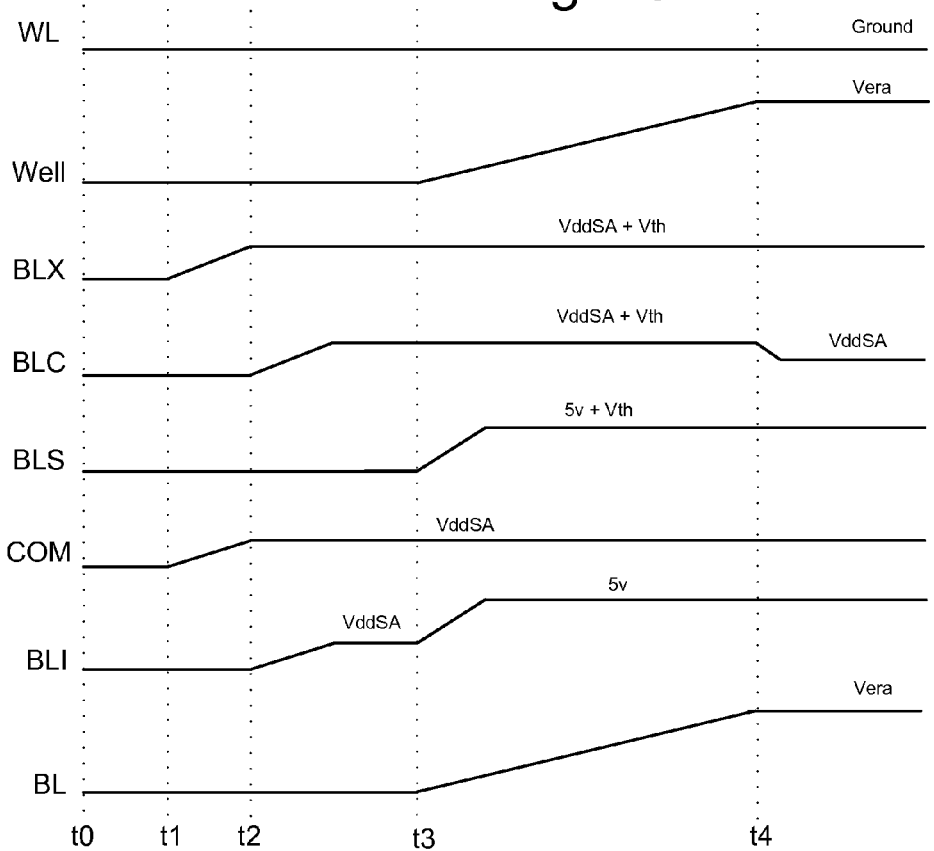
FIG. 19 is a timing diagram describing an erase operation.
Figure 20:
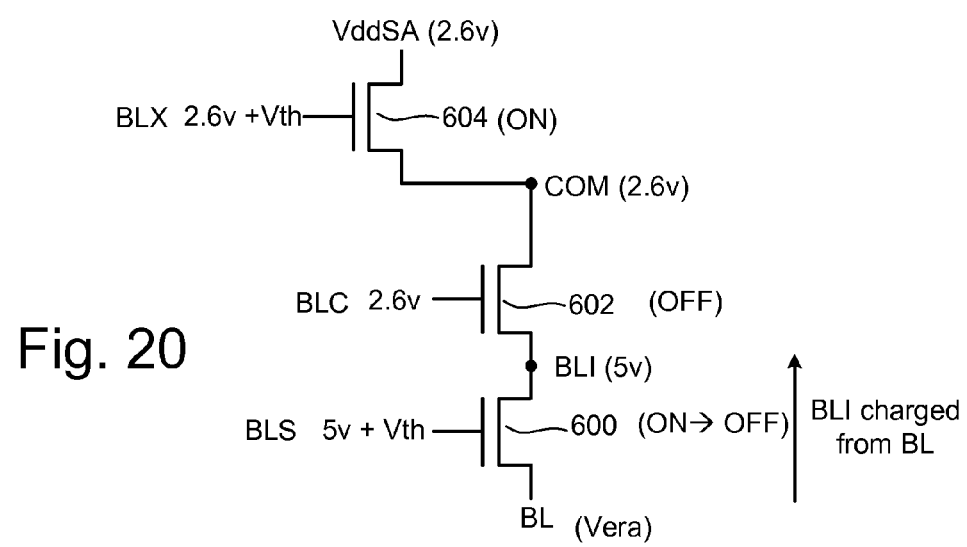
FIG. 20 is a schematic of three transistors associated with a sense amplifier.

FIGS. 19 and 20 describe another embodiment of an erase operation that provides for a lower voltage differential across transistor 600 so that transistor 600 can be made smaller. All of the signals depicted in FIG. 19 operate in the exact same manner as in FIG. 17 except for signal BLC. In FIG. 19, the signal BLC is raised from ground to VddSA+Vth (threshold voltage of transistor 602) at time t2 (just like in FIG. 17), but then lowered down to VddSA at time t4. Note that, in some embodiments, the lowering of BLC from VDDSA+Vth to VDDSA can take place anywhere between t3 and t4. As can be seen from FIG. 20, which shows transistor 600, 602 and 604 just after BLC was lowered at time t4, transistor 602 is off after time t4. Under this scheme, the BLI node was still raised to VddSA through transistors 604 and 602, then subsequently raised to 5 volts from the bit line through transistor 600. However, after BLI reaches 5 volts, transistor 602 is turned off so there can be no leakage through transistor 602. In the embodiment of FIGS. 19 and 20, the gate of transistor 600 (bit line shield transistor) is raised to a level above VddSA prior to completing the ramping up of the well voltage.

Figure 21:
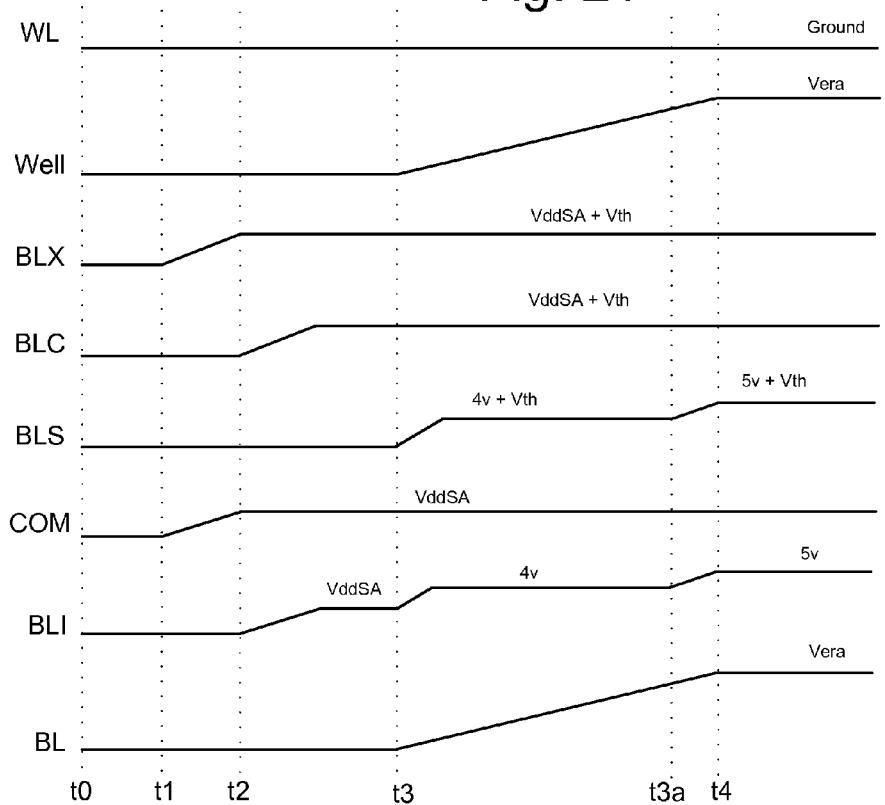
FIG. 21 is a timing diagram describing an erase operation.
Figure 22:
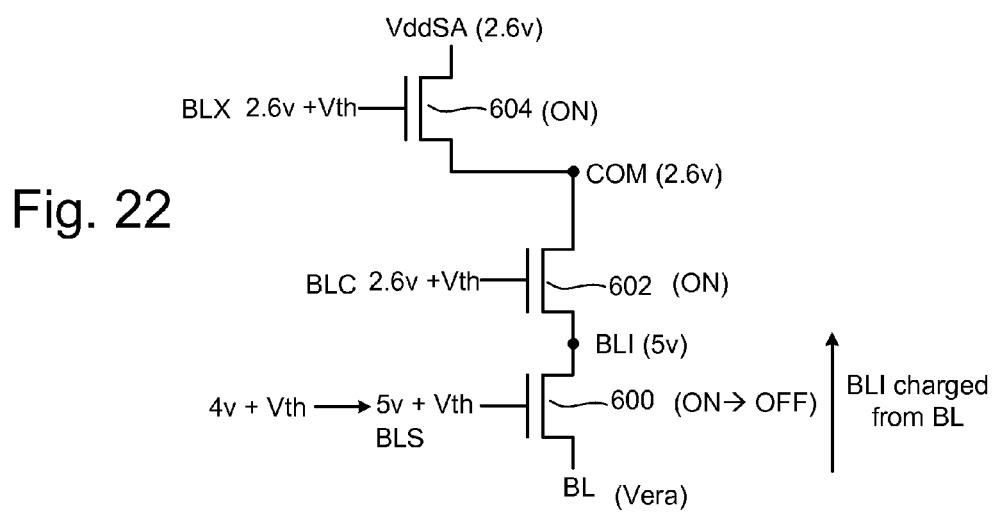
FIG. 22 is a schematic of three transistors associated with a sense amplifier.

FIGS. 21 and 22 describe another embodiment of an erase operation that lowers the voltage differential across transistor 600. One possible concern is the capacitive coupling between the bit line and the gate of transistor 600. As the WELL is ramping up, the bit line voltage is also increasing. The bit line can couple to the gate of transistor 600 and make the gate voltage higher than the desired target. If the gate of transistor 600 couples to a higher voltage, then the BLI node can be driven to an even higher voltage which may result in junction leakage and reduce the WELL ramp rate. To overcome this, the BLS signal can be raised in two (or more), steps, as per FIG. 21.

FIG. 21 shows the same signals as FIGS. 17 and 19. At time t0, all of the depicted signals are at ground. The word lines of the selected blocks remain at ground during the time period depicted in FIG. 21. At time t1, the signal BLX is raised from ground to VddSA+Vth (threshold voltage of transistor 604). In response thereto, the COM node is raised to VddSA (2.6 volts). At time t2, BLC signal is raised to VddSA+Vth (threshold voltage of transistor 602). In response, the BLI node is raised from ground to VddSA. That is, the charge VddSA is communicated from the COM node to the BLI node through transistor 602. At time t3, the WELL voltage begins ramping up to Vera. The bit lines, coupled to the WELL, will also raise up to Vera starting at time t3. The BLS node is raised to 4 volts+Vth (threshold voltage of transistor 600) at time t3. At time t3a, the BLS signal is raised from 4 volts+Vth to 5 volts+Vth (threshold voltage of transistor 600). By time t4, the voltages should have settled. As can be seen, the gate of transistor 600 (bit line shield transistor) is raised to a level above VddSA prior to completing the ramping up of the well voltage.

FIGS. 17, 19 and 21, show the BLS ramp from 0V to coincide with start of CPWELL ramp. In some cases, this ramp to start sometime after t3.

FIG. 22 shows transistor 600, 602 and 604 just after time t4, while memory cells are being erased by having their electrons emitted from the floating gate to the substrate side. Because the gate of transistor 604 is receiving 2.6 volts+Vth, transistor 604 is on and transfers VddSA to the COM node. Because transistor 602 is receiving 2.6 volts+Vth at its gate, transistor 602 is on and is transferring VddSA (2.6 volts) from the COM node to the BLI node. Since the BLS node is raised to 4 volts+Vth and then to 5 volts+Vth, transistor 600 was initially on and transferred part of the charge from the bit line to the BLI node in order to raise the BLI node from VddSA to 4 and then to 5 volts. When BLI node reached 5 volts, transistor 600 will turn off. Therefore, BLI was initially charged up from VddSA from the sense amp and subsequently charged from VddSA to 5 volts from the bit line. Because the gate voltage of transistor 600 was raised in two steps the gate voltage is not caused to overshoot its target due to coupling from the bit line.

The embodiments of FIGS. 17-22 show examples of reducing the voltage differential across the sense amplifier shield transistor (transistor 600) for the same sense amplifier(s) being used for read and programming processes. By reducing the voltage differential, these transistors can be made smaller, thereby reducing the amount of space needed in the integrated circuit for the sense amplifier.

One embodiment includes a method of operating a non-volatile storage system, comprising: creating a voltage differential between a bit line and a sense amplifier connected to the bit line, the sense amplifier includes a clamping device and a shield device, the clamping device is used as a voltage clamp for the bit line during a sensing operation, the shield device is positioned between the clamping device and the bit line, the shield device shields the sense amplifier from high bit line voltages; prior to creating the voltage differential between the bit line and the sense amplifier, turning on the clamping device to allow charge to be communicated across the clamping device; subsequent to starting the creating of the voltage differential between the bit line and the sense amplifier, actively turning off the clamping device to prevent charge to be communicated across the clamping device while the voltage differential between the bit line and the sense amplifier continues to persist; and turning on the shield device to allow a portion of a charge on the bit line to be communicated across the shield device thereby partially counteracting the voltage differential between the bit line and the sense amplifier.

One embodiment includes a non-volatile storage apparatus, comprising: non-volatile storage elements; a bit line in communication with the non-volatile storage elements; a sense amplifier connected to the bit line, the sense amplifier includes a voltage clamp and a bit line interface, the bit line interface is positioned between the voltage clamp and the bit line, the bit line interface shields the sense amplifier from high bit line voltages; and one or more managing circuits in communication with bit line and the sense amplifier, the one or more managing circuits create a voltage differential between the bit line and the sense amplifier, the one or more managing circuits turn on the voltage clamp prior to creating the voltage differential in order to allow charge to be communicated across the voltage clamp, the one or more managing circuits actively turn off the voltage clamp to prevent charge from being communicated across the voltage clamp while the voltage differential between the bit line and the sense amplifier continues to persist, the one or more managing circuits turn on the bit line interface to allow a portion of a charge on the bit line to be communicated across the bit line interface thereby partially counteracting the voltage differential between the bit line and the sense amplifier.

One embodiment includes a method of operating a non-volatile storage system, comprising: creating a voltage differential between a bit line and a sense amplifier connected to the bit line, the sense amplifier includes a shield device, the shield device is positioned at the interface of the sense amplifier and the bit line, the shield device shields the sense amplifier from high bit line voltages; turning on the shield device to allow a portion of a charge on the bit line to be communicated across the shield device thereby partially counteracting the voltage differential between the bit line and the sense amplifier during a first time period while creating the voltage differential between the bit line and the sense amplifier; operating the shield device in an off condition during a second time period while creating the voltage differential between the bit line and the sense amplifier, the second time period is immediately subsequent to the first time period; and turning on the shield device to allow a portion of a charge on the bit line to be communicated across the shield device thereby partially counteracting the voltage differential between the bit line and the sense amplifier during a third time period while creating the voltage differential between the bit line and the sense amplifier, the third time period is immediately subsequent to the second time period.

One embodiment includes a non-volatile storage apparatus, comprising: non-volatile storage elements; a bit line in communication with the non-volatile storage elements; a sense amplifier connected to the bit line, the sense amplifier includes a bit line interface at a connection of the sense amplifier to the bit line, the bit line interface shields the sense amplifier from high bit line voltages; and one or more managing circuits in communication with bit line, the one or more managing circuits cause a voltage differential between the bit line and the sense amplifier, the one or more managing circuits turn on the bit line interface to allow a portion of a charge on the bit line to be communicated across the bit line interface thereby partially counteracting the voltage differential between the bit line and the sense amplifier during a first time period while the voltage differential exists between the bit line and the sense amplifier, the one or more managing circuits operate the bit line interface in an off condition during a second time period while the voltage differential between the bit line and the sense amplifier exists, the second time period is immediately subsequent to the first time period, the one or more managing circuits turn on the bit line interface to allow a portion of a charge on the bit line to be communicated across the bit line interface thereby partially counteracting the voltage differential between the bit line and the sense amplifier during a third time period while the voltage differential between the bit line and the sense amplifier exists, the third time period is immediately subsequent to the second time period.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:

1. A method of erasing non-volatile storage system, comprising:

creating a voltage differential between a bit line and a sense amplifier connected to the bit line as part of an erase process for a plurality of non-volatile memory elements in communication with the bit line, the sense amplifier includes a clamping device and a shield device, the clamping device is used as a voltage clamp for the bit line during a sensing operation, the shield device is positioned between the clamping device and the bit line, the shield device shields the sense amplifier from high bit line voltages, the sense amplifier further includes a node between the clamping device and the shield device;

prior to creating the voltage differential between the bit line and the sense amplifier, and as part of the erase process, turning on the clamping device to allow charge to be communicated across the clamping device in order to charge up the node;

subsequent to starting the creating of the voltage differential between the bit line and the sense amplifier, actively turning off the clamping device to prevent additional charge to be communicated across the clamping device to the node while the voltage differential between the bit line and the sense amplifier continues to persist;

turning on the shield device to allow a portion of a charge on the bit line to be communicated across the shield device to charge up the node, thereby partially counteracting the voltage differential between the bit line and the sense amplifier; and erasing the plurality of non-volatile memory elements connected to the bit line while the node remains charged, as part of the erase process.

2. The method of claim 1, wherein:
the clamping device includes a first transistor;
the shield device includes a second transistor;
the creating the voltage differential between the bit line and the sense amplifier includes ramping up a well voltage for the non-volatile storage system;
the turning on the clamping device includes raising a gate voltage for the first transistor;
the actively turning off the clamping device comprises lowering the gate voltage for the first transistor; and
the turning on the shield device includes raising a gate voltage for the second transistor.

3. The method of claim 2, wherein:
the turning on the shield device includes raising the gate voltage for the second transistor to a voltage greater than VddSA, wherein VddSA is the largest voltage generated in a sense amplifier for reading and programming data with respect to memory cells connected to the bit line.

4. The method of claim 3, wherein:
the turning on the clamping device includes raising the gate voltage for the first transistor to a voltage greater than VddSA; and
the actively turning off the clamping device comprises lowering the gate voltage for the first transistor to VddSA.

5. The method of claim 1, wherein:
the creating the voltage differential between the bit line and the sense amplifier includes ramping up a well voltage for the non-volatile storage system to an erase voltage, the plurality of non-volatile memory elements are erased in response to the erase voltage; and
the turning on the clamping device and the turning on the shield device result in the node being charged from by the sense amplifier via the clamping device and from the bit line via the shield device.

6. The method of claim 5, wherein:
the clamping device is a first transistor;
the shield device is a second transistor; and
one side of the shield device is at an erase voltage and another side of the shield device that includes the node is at node voltage that is lower than the erase voltage, a magnitude of the node voltage is limited by a junction break down tolerance of the first transistor and a low voltage source junction of the second transistor.

7. A non-volatile storage apparatus, comprising:
non-volatile storage elements;
a bit line in communication with the non-volatile storage elements;
a sense amplifier connected to the bit line, the sense amplifier includes a voltage clamp and a bit line interface, the bit line interface is positioned between the voltage clamp and the bit line, the bit line interface shields the sense amplifier from high bit line voltage, the sense amplifier includes a node between the voltage clamp and the bit line interface; and
one or more managing circuits in communication with bit line and the sense amplifier, the one or more managing circuits create a voltage differential between the bit line and the sense amplifier as part of an erase process for the non-volatile storage elements, the one or more managing circuits turn on the voltage clamp as part of the erase process prior to creating the voltage differential in order to allow charge to be communicated across the voltage clamp in order to charge up the node, the one or more managing circuits actively turn off the voltage clamp to prevent additional charge from being communicated across the voltage clamp to the node while the voltage differential between the bit line and the sense amplifier continues to persist, the one or more managing circuits turn on the bit line interface to allow a portion of a charge on the bit line to be communicated across the bit line interface to charge up the node and thereby partially counteract the voltage differential between the bit line and the sense amplifier, the one or more managing circuits erase the non-volatile storage elements as part of the erase process while the node remains charged.

8. The non-volatile storage apparatus of claim 7, wherein:
the voltage clamp includes a first transistor;
the bit line interface includes a second transistor;
the one or more managing circuits create the voltage differential between the bit line and the sense amplifier by ramping up a well voltage;
the one or more managing circuits turn on the voltage clamp by raising a gate voltage for the first transistor;

the one or more managing circuits turn off the voltage clamp by lowering the gate voltage for the first transistor; and the one or more managing circuits turn on the bit line interface by raising a gate voltage for the second transistor.

9. The non-volatile storage apparatus of claim 8, wherein:
the one or more managing circuits turn on the bit line interface by raising the gate voltage for the second transistor to a voltage greater than VddSA, wherein VddSA is the largest voltage generated in the sense amplifier for reading and programming data with respect to memory cells connected to the bit line.

10. The non-volatile storage apparatus of claim 9, wherein:
the one or more managing circuits turn on the voltage clamp by raising the gate voltage for the first transistor to a voltage greater than VddSA; and
the one or more managing circuits turn off the voltage clamp by lowering the gate voltage for the first transistor to VddSA.

11. The non-volatile storage apparatus of claim 7, wherein:
the one or more managing circuits create the voltage differential between the bit line and the sense amplifier by ramping up a well voltage to an erase voltage, the non-volatile storage elements are erased in response to the erase voltage.

12. The non-volatile storage apparatus of claim 11, wherein:
the voltage clamp is a first transistor;
the bit line interface is a second transistor; and
one side of the second transistor is at an erase voltage and another side of the second transistor is at a node voltage that is lower than the erase voltage, a magnitude of the node voltage is limited by a junction break down tolerance of the first transistor and a low voltage source junction of the second transistor.

13. The non-volatile storage apparatus of claim 7, wherein:
the non-volatile storage elements are flash memory devices; and
the non-volatile storage elements are part of a three dimensional memory structure.

14. A method of erasing non-volatile storage system, comprising:
creating a voltage differential between a bit line and a sense amplifier connected to the bit line during an erase process for a plurality of non-volatile storage elements, the sense amplifier includes a shield device, the shield device is positioned at the interface of the sense amplifier and the bit line, the shield device shields the sense amplifier from high bit line voltages;
turning on the shield device during the erase process to allow a portion of a charge on the bit line to be communicated across the shield device to a node in the sense amplifier thereby partially counteracting the voltage differential between the bit line and the sense amplifier during a first time period while creating the voltage differential between the bit line and the sense amplifier;
operating the shield device in an off condition during a second time period while creating the voltage differential between the bit line and the sense amplifier, the second time period is subsequent to the first time period and is during the erase process;
turning on the shield device to allow a portion of a charge on the bit line to be communicated across the shield device to the node in the sense amplifier thereby partially counteracting the voltage differential between the bit line and the sense amplifier during a third time period while creating the voltage differential between the bit line and the sense amplifier, the third time period is subsequent to the second time period and is during the erase process; and
erasing the plurality of non-volatile storage elements during the erase process while the node remains charged.

15. The method of claim 14, wherein:
the shield device is a transistor;
the creating the voltage differential between the bit line and the sense amplifier includes ramping up a well voltage for the non-volatile storage system;
the turning on the shield device during the first time period includes raising a gate voltage for the transistor to a first voltage while ramping up the well voltage;
the turning on the shield device during the third time period includes raising the gate voltage for the transistor to a second voltage while ramping up the well voltage, the second voltage is greater than the first voltage; and
the operating the shield device in the off condition during the second time period includes maintaining the gate voltage for the transistor below a threshold.

16. The method of claim 15, wherein:
the turning on the shield device includes raising the gate voltage for the transistor to a voltage greater than VddSA, wherein VddSA is the largest voltage generated in a sense amplifier for reading and programming data with respect to memory cells connected to the bit line.

17. The method of claim 14, wherein the sense amplifier includes a voltage clamp, the node is between the voltage clamp and the shield device, the method further comprising:
prior to creating the voltage differential between the bit line and the sense amplifier, and as part of the erase process, turning on the voltage clamp to allow charge to be communicated across the voltage clamp in order to charge up the node; and
the turning on the voltage clamp, the turning on the shield device during the first time period, and the turning on the shield device during the third time period results in the node being charged from by the sense amplifier via the voltage clamp and from the bit line via the shield device.

18. The method of claim 17, wherein:
the shield device is a transistor;
a first side of the shield device is at an erase voltage and a second side of the shield device is at node voltage that is lower than the erase voltage;
the second side is charged to an initial voltage from the sense amplifier during the first time period; and
the second side is charged from the initial voltage to the node voltage by the bit line during the third time period.

19. A non-volatile storage apparatus, comprising:
non-volatile storage elements;
a bit line in communication with the non-volatile storage elements;
a sense amplifier connected to the bit line, the sense amplifier includes a bit line interface at a connection of the sense amplifier to the bit line, the bit line interface shields the sense amplifier from high bit line voltages, the sense amplifier further includes a node on a first side of the bit line interface with the bit line being on a second side of the bit line interface; and
one or more managing circuits in communication with bit line, the one or more managing circuits cause a voltage differential between the bit line and the sense amplifier during an erase process for the non-volatile storage elements, the one or more managing circuits turn on the bit line interface during the erase process to allow a portion of a charge on the bit line to be communicated across the bit line interface to the node thereby partially counteracting the voltage differential between the bit line and the sense amplifier during a first time period while the voltage differential exists between the bit line and the sense amplifier, the one or more managing circuits operate the bit line interface in an off condition during a second time period during the erase process while the voltage differential between the bit line and the sense amplifier exists, the second time period is subsequent to the first time period, the one or more managing circuits turn on the bit line interface to allow a portion of a charge on the bit line to be communicated across the bit line interface to the node thereby partially counteracting the voltage differential between the bit line and the sense amplifier during a third time period while the voltage differential between the bit line and the sense amplifier exists, the third time period is subsequent to the second time period and is during the erase process, the one or more managing circuits erase the non-volatile storage elements as part of the erase process while the node remains charged.

20. The non-volatile storage apparatus of claim 19, wherein:
the bit line interface is a transistor;
the one or more managing circuits cause the voltage differential between the bit line and the sense amplifier by ramping up a well voltage for the non-volatile storage system;
the one or more managing circuits turn on the bit line interface during the first time period by raising a gate voltage for the transistor to a first voltage while ramping up the well voltage; and
the one or more managing circuits turn on the bit line interface during the third time period by raising the gate voltage for the transistor to a second voltage while ramping up the well voltage, the second voltage is greater than the first voltage.

21. The non-volatile storage apparatus of claim 20, wherein:
the one or more managing circuits turn on the bit line interface during the first time period by raising the gate voltage for the transistor to a voltage greater than VddSA, wherein VddSA is the largest voltage generated in a sense amplifier for reading and programming data with respect to memory cells connected to the bit line.

22. The non-volatile storage apparatus of claim 19, wherein:
the one or more managing circuits cause the voltage differential between the bit line and the sense amplifier by ramping up a well voltage for the non-volatile storage system to an erase voltage, the memory cells are erased in response to the erase voltage.

23. The non-volatile storage apparatus of claim 22, wherein:
the non-volatile storage elements are part of a three dimensional memory structure.

24. The non-volatile storage apparatus of claim 19, wherein:
the sense amplifier includes a voltage clamp, the node is between the voltage clamp and the shield device;
prior to creating the voltage differential between the bit line and the sense amplifier, the one or more managing circuits turn on the voltage clamp to allow charge to be communicated across the voltage clamp in order to charge up the node; and
the turning on the voltage clamp, the turning on the shield device during the first time period, and the turning on the shield device during the third time period results in the node being charged from by the sense amplifier via the voltage clamp and from the bit line via the shield device.

25. The method of claim 1, wherein:
the plurality of non-volatile storage elements are part of a three dimensional memory structure.

* * * * *